United States Patent
Zhao et al.

(10) Patent No.: US 10,236,216 B2
(45) Date of Patent: Mar. 19, 2019

(54) METHOD FOR MANUFACTURING A SEMICONDUCTOR DEVICE HAVING A FIN LOCATED ON A SUBSTRATE

(71) Applicants: Semiconductor Manufacturing International (Shanghai) Corporation, Shanghai (CN); SMIC Advanced Technology Research & Development (Shanghai) Corporation, Shanghai (CN); IMEC International, Leuven (BE)

(72) Inventors: Hai Zhao, Shanghai (CN); Yang Liu, Shanghai (CN); Gang Mao, Shanghai (CN); Cheng-Jui Yang, Shanghai (CN); Yongmeng Lee, Shanghai (CN); Shaofeng Yu, Shanghai (CN)

(73) Assignees: SEMICONDUCTOR MANUFACTURING INTERNATIONAL (SHANGHAI) CORP., Shanghai (CN); SMIC ADVANCED TECHNOLOGY RESEARCH & DEVELOPMENT (SHANGHAI) Corp., Shanghai (CN); IMEC INTERNATIONAL, Leuven (BE)

( * ) Notice: Subject to any disclaimer, the term of this patent is extended or adjusted under 35 U.S.C. 154(b) by 0 days.

(21) Appl. No.: 15/723,723

(22) Filed: Oct. 3, 2017

(65) Prior Publication Data
US 2018/0108572 A1 Apr. 19, 2018

(30) Foreign Application Priority Data
Oct. 17, 2016 (CN) .......................... 2016 1 0899633

(51) Int. Cl.
*H01L 21/8234* (2006.01)
*H01L 27/088* (2006.01)
(Continued)

(52) U.S. Cl.
CPC ............. *H01L 21/823481* (2013.01); *H01L 21/823431* (2013.01); *H01L 27/0886* (2013.01);
(Continued)

(58) Field of Classification Search
CPC ....... H01L 29/66795; H01L 21/823431; H01L 27/0886; H01L 29/42392;
(Continued)

(56) References Cited

U.S. PATENT DOCUMENTS 9,184,087 B2 * 11/2015 Chiang ............... H01L 21/2636
9,368,496 B1    6/2016 Yu et al.
(Continued)

FOREIGN PATENT DOCUMENTS

EP    3 163 628 A1    5/2017

OTHER PUBLICATIONS

European Search Report for corresponding European Application No. 17196801.9 dated Feb. 28, 2018 (8 pages).

*Primary Examiner* — Khiem D Nguyen
(74) *Attorney, Agent, or Firm* — Brinks Gilson & Lione

(57) ABSTRACT

The present disclosure relates to the technical field of semiconductor processes, and discloses a semiconductor device and a manufacturing method therefor. The semiconductor device includes a substrate; two fins located on the substrate and extending along a first direction; an isolation material layer surrounding the fins, comprising a first isolation regions located at an end region between the two fins along the first direction, and a second isolation region located at sides of the fins along a second direction that is
(Continued)

different from the first direction, wherein an upper surface of the first isolation region substantially align with an upper surfaces of the fins, and an upper surface of the second isolation region is lower than the upper surface of the fins; and a first insulating layer on the first isolation region.

10 Claims, 17 Drawing Sheets

(51) Int. Cl.
    *H01L 29/06*     (2006.01)
    *H01L 29/66*     (2006.01)
    *H01L 29/78*     (2006.01)
    *H01L 29/16*     (2006.01)
    *H01L 29/165*    (2006.01)

(52) U.S. Cl.
    CPC ...... *H01L 29/0649* (2013.01); *H01L 29/6656* (2013.01); *H01L 29/66795* (2013.01); *H01L 29/785* (2013.01); *H01L 29/7848* (2013.01); *H01L 29/165* (2013.01); *H01L 29/1608* (2013.01)

(58) Field of Classification Search
    CPC ........... H01L 21/823481; H01L 29/785; H01L 21/76267; H01L 29/66545
    See application file for complete search history.

(56) References Cited

U.S. PATENT DOCUMENTS

| | | | | |
|---|---|---|---|---|
| 2008/0012053 | A1* | 1/2008 | Kujirai | H01L 21/76232 |
| | | | | 257/288 |
| 2008/0105931 | A1* | 5/2008 | Kang | H01L 29/66795 |
| | | | | 257/397 |
| 2009/0101991 | A1* | 4/2009 | Kim | H01L 21/823437 |
| | | | | 257/396 |
| 2013/0344678 | A1* | 12/2013 | Oh | H01L 21/76229 |
| | | | | 438/427 |
| 2015/0147860 | A1* | 5/2015 | Kim | H01L 29/66795 |
| | | | | 438/283 |
| 2016/0079125 | A1 | 3/2016 | Kim | |
| 2016/0225848 | A1 | 8/2016 | Zang et al. | |

* cited by examiner

METHOD FOR MANUFACTURING A SEMICONDUCTOR DEVICE HAVING A FIN LOCATED ON A SUBSTRATE

CROSS-REFERENCE TO RELATED APPLICATION

This application is based on and claims priority to Chinese Patent Application CN201610899633.X, filed Oct. 17, 2016, the entire content of which is incorporated herein by reference.

BACKGROUND

Technical Field

The present disclosure relates to the technical field of semiconductors, and particularly to a semiconductor device and a manufacturing method therefor.

Related Art

In a Fin Field Effect Transistor (FinFET), to control the critical dimension (CD) uniformity, a dummy gate structure may be formed on a shallow trench isolation (STI) region. In addition, to improve FinFET device performance, an end portion of a fin adjacent to the dummy gate structure often needs to be etched so as to form recesses, thereby bringing in a desired stress into a channel through epitaxially growing a semiconductor material in the recess.

However, in normal designs, the STI region is lower than the fin. Therefore, a bottom portion of the dummy gate structure on the STI region is also lower with respect to the fin. If there is a manufacturing deviation from designed alignment precision, the dummy gate structure formed on the STI region may shift in position. As a result of the shift, the dummy gate structure may inadvertently make contact to the fin, forming a bridge. This may cause an electrical leakage that reduces the device performance and reliability. In addition, the shift of the dummy gate structure may further affect a contour of the epitaxially grown semiconductor material in the recesses. This may decrease the desired stress brought to the channel, thereby lowering carrier mobility of the device and consequently reducing device performance.

SUMMARY

To address at least one of the foregoing problems and improve device reliability and carrier mobility, the present disclosure proposes the at least the following forms of implementations.

According to a form of the present disclosure, a method for manufacturing a semiconductor device is provided, including providing a substrate structure, wherein the substrate structure contains a substrate; a fin located on the substrate and extending along a first direction; and an isolation material layer on the substrate, the isolation material surrounding the fin and defining an upper surface that substantially aligns with an upper surface of the fin, wherein the isolation material layer comprises a first isolation region located at an end region of the fin along the first direction, and a second isolation region located at sides of the fin along a second direction different from the first direction; successively forming a first insulating layer, a second insulating layer, and a third insulating layer on the substrate structure above the fin; forming a patterned barrier layer above the third insulating layer, the patterned barrier layer covering the first isolation region and a corresponding part of the third insulating layer above the first isolation region; successively: performing a first etching process using the patterned barrier layer as a mask to remove an exposed portion of the third insulating layer and to expose a portion of the second insulating layer thereunder, removing the barrier layer to expose a remaining portion of third insulating layer above the first isolation region, performing a second etching process using the remaining portion of the third insulating layer as a mask to remove the exposed portion of the second insulating layer and to expose a portion of the first insulating layer thereunder, performing a third etching process to remove the remaining portion of the third insulating layer and expose a remaining portion of the second insulating layer thereunder, and to remove the exposed portion of the first insulating layer, removing an upper part of the second isolation region, and removing the remaining portion of the second insulating layer to expose a remaining portion of the first insulating layer thereunder.

In a form, the patterned barrier layer above, when formed, further extends beyond the first isolation region and covers the third insulating layer above at least one portion of the fin adjacent to the first isolation region along the first direction.

In a form, the first insulating layer and the second insulating layer above have different etching selectivity ratios; and the second insulating layer and the third insulating layer have different etching selectivity ratios.

In a form, the first insulating layer is an oxide layer; the second insulating layer is a nitride layer; and the third insulating layer is an oxide layer.

In a form, the steps of providing the substrate structure above include: providing an initial substrate; forming a patterned hard mask on the initial substrate; etching the initial substrate using the hard mask as a shield, so as to form the substrate and the fin located on the substrate; depositing the isolation material layer to fill a space around the fin, wherein an upper surface of the isolation material layer substantially aligns with the upper surface of the patterned hard mask; etching back the isolation material to expose the patterned hard mask; and removing the patterned hard mask, so as to form the substrate structure.

In a form, the initial substrate above includes a base semiconductor layer and a base oxide layer located on the base semiconductor layer; and the fin accordingly includes a semiconductor layer and an oxide layer located on the semiconductor layer.

In a form, the method above further includes: forming a first gate structure on the fin, and forming a second gate structure on the remaining first insulating layer.

In a form, the method further includes: etching, by using the first gate structure and the second gate structure as masks, the fin at two sides of the first gate structure corresponding to two ends of the fin along the first direction to form recesses; and epitaxially growing a semiconductor material in the recesses to form a source region and a drain region.

In a form, the epitaxially grown semiconductor material includes SiGe or SiC.

In a form, the first gate structure comprises a first gate dielectric layer on the fin above, a first gate on the first gate dielectric layer, a first hard mask layer on the first gate, and a first spacer at side walls of the first gate dielectric layer, the first gate, and the first hard mask layer along the second direction; and the second gate structure includes a second gate dielectric layer on the remaining first insulating layer, a second gate on the second gate dielectric layer, a second hard mask layer on the second gate, and a second spacer at side walls of the second gate dielectric layer, the second gate, and the second hard mask layer along the second direction, wherein the second spacer is above and overlaps an end portion of the fin adjacent to the first isolation region below the second gate structure.

In a form, the first gate dielectric layer and the second gate dielectric layer include silicon oxide; the first gate and the second gate comprise polysilicon; and the first hard mask layer and the second hard mask layer comprise silicon nitride.

According to another form of the present disclosure, a semiconductor device is provided, including: a substrate; a fin located on the substrate and extending along a first direction; an isolation material layer surround the fins including a first isolation region located at an end of the fin along the first direction and a second isolation region located at sides of the fin along a second direction different from the first direction, wherein an upper surface of the first isolation region substantially aligns with an upper surface of the fin, and an upper surface of the second isolation region is lower than the upper surfaces of the fin. The semiconductor device further includes a first insulating layer on the first isolation region.

In a form, the first insulating layer above further covers an end portion of the fin adjacent to the first isolation region.

In a form, the device above further includes: a first gate structure on the fin, and a second gate structure on the first insulating layer.

In a form, the device above further includes: a source region and a drain region formed by epitaxially growing a semiconductor material in the fin at two sides of the first gate structure, the two sides corresponding to two ends of the fin along the first direction In a form, the epitaxially grown semiconductor material above includes SiGe or SiC.

In a form, the first gate structure above includes a first gate dielectric layer on the fin, a first gate on the first gate dielectric layer, a first hard mask layer on the first gate, and a first spacer at side walls of the first gate dielectric layer, the first gate, and the first hard mask layer along the second direction; and the second gate structure comprises a second gate dielectric layer on the remaining first insulating layer, a second gate on the second gate dielectric layer, a second hard mask layer on the second gate, and a second spacer at side walls of the second gate dielectric layer, the second gate, and the second hard mask layer along the second direction, wherein the second spacer is above and overlaps an end portion of the fin adjacent to the first isolation region below the second gate structure.

In a form, the first gate dielectric layer and the second gate dielectric layer comprise silicon oxide; the first gate and the second gate comprise polysilicon; and the first hard mask layer and the second hard mask layer comprise silicon nitride.

According to the forms above, a first isolation region and a second isolation region of different heights are obtained. An upper surface of the first isolation region substantially aligns with the upper surface of the fin, and a first insulating layer is formed on the first isolation region. Therefore, even though a dummy gate structure which may be subsequently formed on the first insulating layer (corresponding the second gate structure below) may deviate in position due to imprecision in manufacturing process, the deviation would not form a bridge between the fin and another fin, thereby reducing electrical leakage that may occur when the dummy gate structure forms a bridge between the fin and the other fin. The processes above thus improve the device performance and reliability. In addition, although the dummy gate structure may deviate in position, a contour of a semiconductor material that may later be epitaxially grown in the fin (see below) would not be affected. Therefore, the stress introduced into a channel would not be affected, and the carrier mobility of a device is consequently improved.

According to the following detailed descriptions of the forms for illustration purposes of the present disclosure with reference to the accompanying drawings, other characters and advantages of the present disclosure will become clear.

BRIEF DESCRIPTION OF THE DRAWINGS

The accompanying drawings form a part of the specification, describe various exemplary forms for illustration purposes of the present disclosure, and are used to explain the principles of the present disclosure together with the specification. In the accompanying drawings.

DETAILED DESCRIPTION

Figure 1:
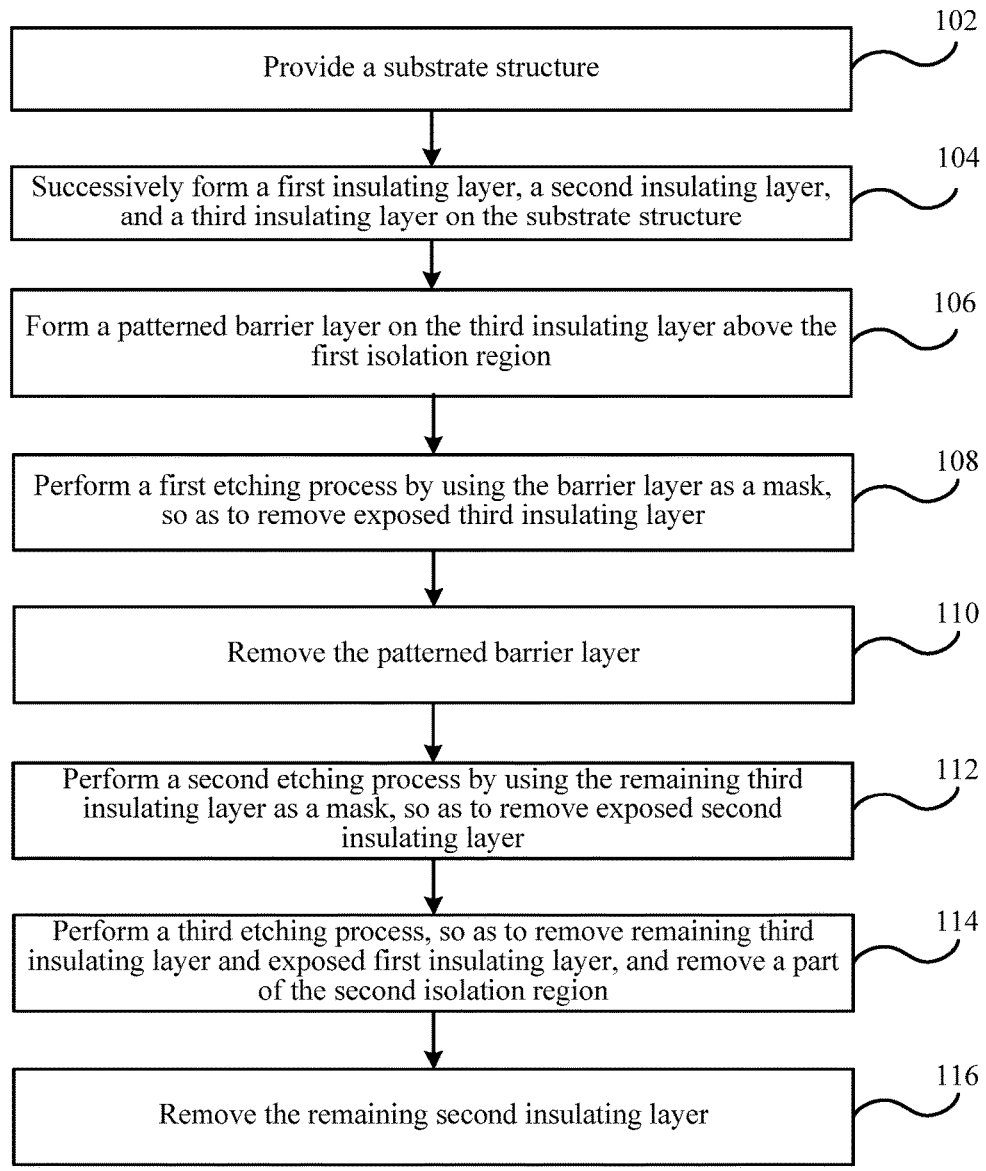
FIG. 1 is a flowchart of a method for manufacturing a semiconductor device.

Various exemplary forms for illustration purposes of the present disclosure are described in details with reference to the accompanying drawings. It should be noted that unless being described in detail, relative layouts, mathematical expressions, and numeric values of components and steps described in these forms should not be understood as a limitation to the scope of the present disclosure.

In addition, it should be understood that for convenience of description, sizes of the parts shown in the accompanying drawings may not necessarily be drawn according to an actual proportional relationship. For example, thicknesses or widths of some layers may be magnified with respect to other layers.

The following description about the forms for illustration purposes is only illustrative, and would not be used as any limitation on the present disclosure and applications or uses of the present disclosure in any way.

Technologies, methods, and devices that are known by a person of ordinary skill in the relate fields may not be discussed in detail. However, in cases in which these technologies, methods, and devices are applicable, these technologies, methods, and devices should be considered as a part of the description.

It should be noted that similar reference numerals, labels, and letters represent similar items in the following accompanying drawings. Therefore, once an item is defined or described in a figure, the item needs not to be further discussed in the description of the subsequent figures.

FIG. 1 is a flowchart of a method for manufacturing a semiconductor device. FIG. 2A to FIG. 9B show cross-sectional views of different phases of a method for manufacturing a semiconductor device. The method for manufacturing a semiconductor device is described in the following with reference to FIG. 1 and FIG. 2A to FIG. 9B.

Figure 2A:
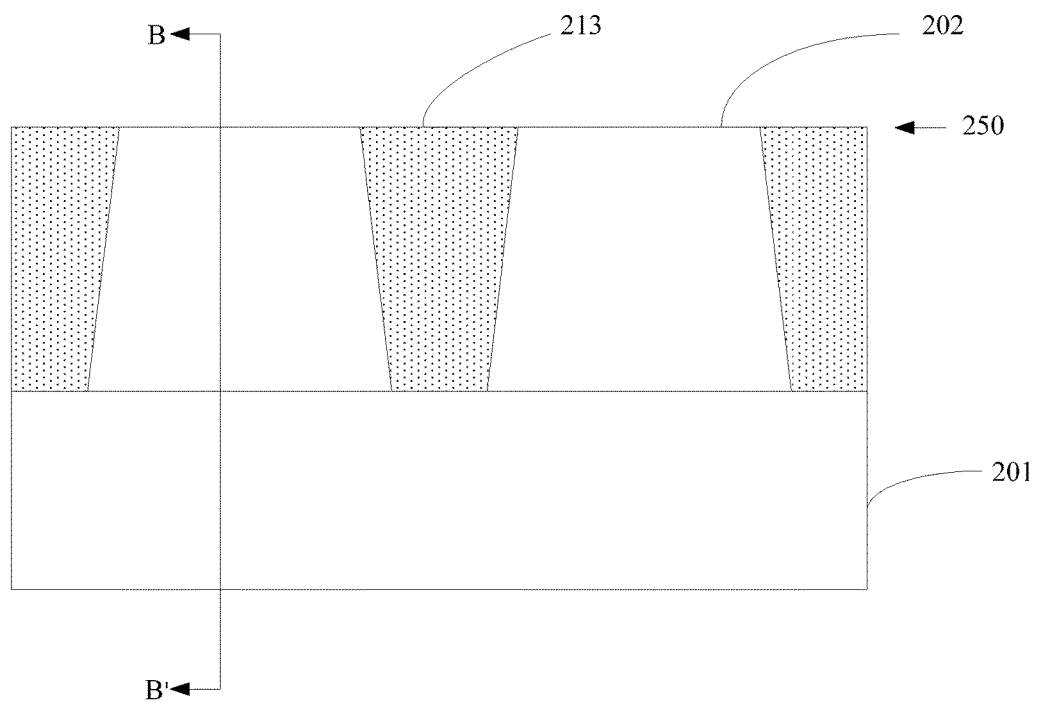
FIGS. 2A, 3A, 4, 5A, 6, 7A, 8A, 9A, 10-12, 13A, 14A, 15A, 16A, and 17A show cross-sectional views of a semiconductor device along a first direction in various phases during a method for manufacturing the semiconductor device.
Figure 2B:
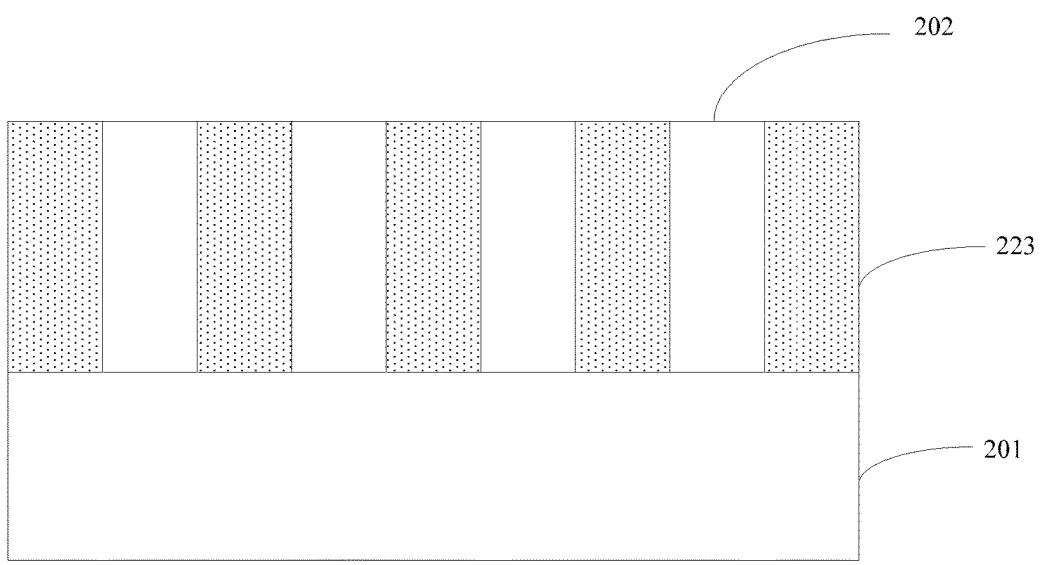
FIGS. 2B, 3B, 5B, 7B, 8B, 9B, 13B, 14B, 15B, 16B, and 17B show cross-sectional views along a second direction of the semiconductor device in various phases during the method for manufacturing the semiconductor device.

As shown in FIG. 1, in step 102, a substrate structure is provided. FIG. 2A shows a cross-sectional view along a first direction of a substrate structure. FIG. 2B is a cross-sectional view intercepted along B-B' shown in FIG. 2A, and may also be referred to as a cross-sectional view along a second direction. In FIG. 2A, the first direction is parallel to the cross-section shown. In FIG. 2B, the second direction is parallel to the cross-section shown.

As shown in FIG. 2A and FIG. 2B, the substrate structure includes a substrate 201. The substrate 201 may be, for example, a silicon substrate, a silicon-on-insulator (SOI) substrate, or a substrate of a group III-V semiconductor material.

The substrate structure further includes one or more fins 202 located on the substrate 201 and extending along the first direction. Herein, the first direction also refers to a direction along which the fins 202 extend. Because channels for FinFET devices based on these fins run along the extending direction of the fins, the first direction may also be referred to as a direction along a channel. It should be noted that the material of the fins 202 may be same as that of the substrate, and may alternatively be different from that of the substrate.

The substrate structure further includes an isolation material layer surrounding the fins 202. Herein, an upper surface of the isolation material layer substantially aligns with upper surfaces of the fins 202, i.e., within an error range of manufacturing processes, as shown by 250. The isolation material layer comprises one or more first isolation regions 213 and one or more second isolation regions 223. The first isolation regions 213 are located on ends of the fins along the extending direction of the fins (the first direction). The second isolation regions 223 are located on sides of the fins and along the second direction. Herein, the second direction may be, for example, a direction approximately perpendicular to the first direction, and may also be referred to as a direction perpendicular to the channel. The first isolation regions 213 may be located on any end of two ends along the first direction of a fin 202, and may also be located on both ends along the first direction of a fins 202. Similarly, the second isolation regions 223 may be located on any side of the two sides along the second direction of a fin 202, and may also be located on both sides along the second direction of fins 202. In a form, the materials of the isolation regions may be a dielectric material such as an oxide, a nitride, or an oxide of nitrogen.

Figure 3A:
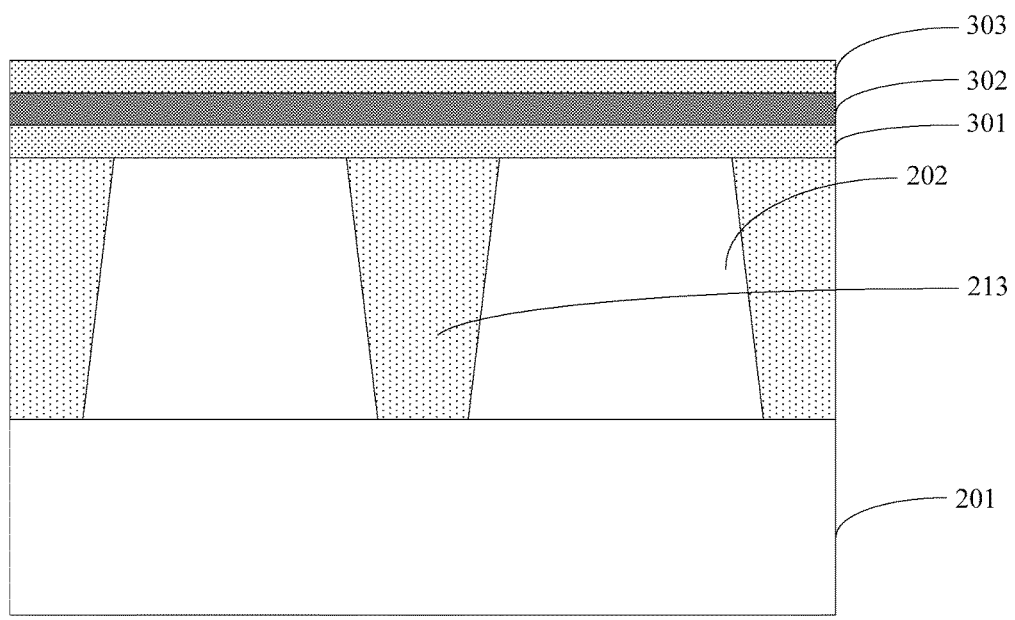
Figure 3B:
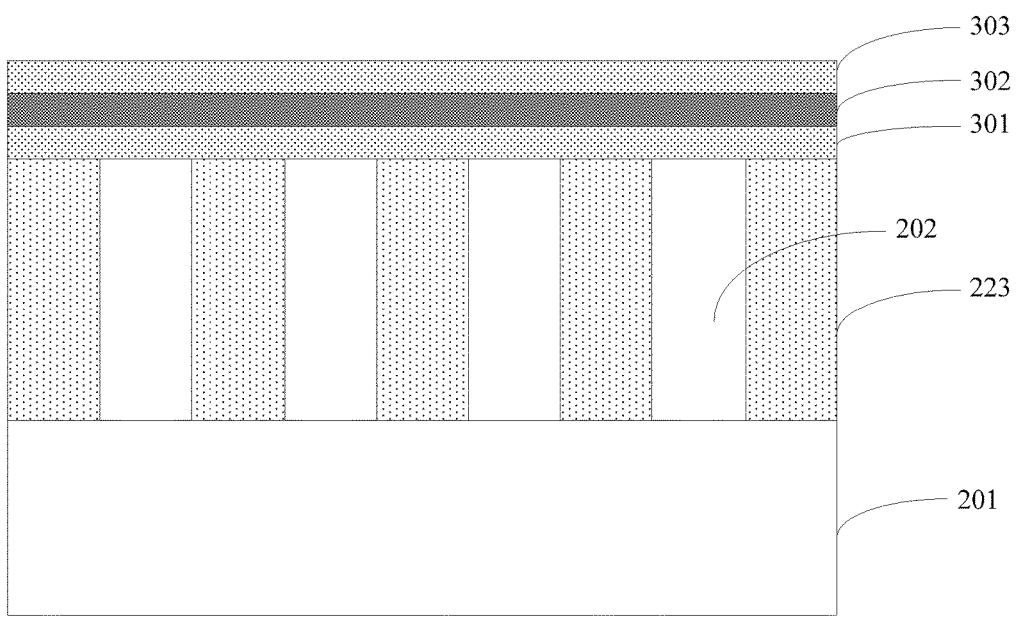

Subsequently, in step 104, a first insulating layer 301, a second insulating layer 302, and a third insulating layer 303 on the substrate structure is successively formed, as shown in FIG. 3A and FIG. 3B (cross-sectional views along the first and second directions). Preferably, the first insulating layer 301 and the second insulating layer 302 may have different etching selectivity ratios. Preferably, the second insulating layer 302 and the third insulating layer 303 may have different etching selectivity ratios. In a specific implementation, the first insulating layer 301 may be an oxide layer, for example, a silicon oxide layer; the second insulating layer 302 may be a nitride layer, for example, a silicon nitride layer; and the third insulating layer may be an oxide layer, for example, a silicon oxide layer. It should be understood that the first insulating layer 301, the second insulating layer 302, and the third insulating layer 303 are not limited to the specific examples given above.

Figure 4:
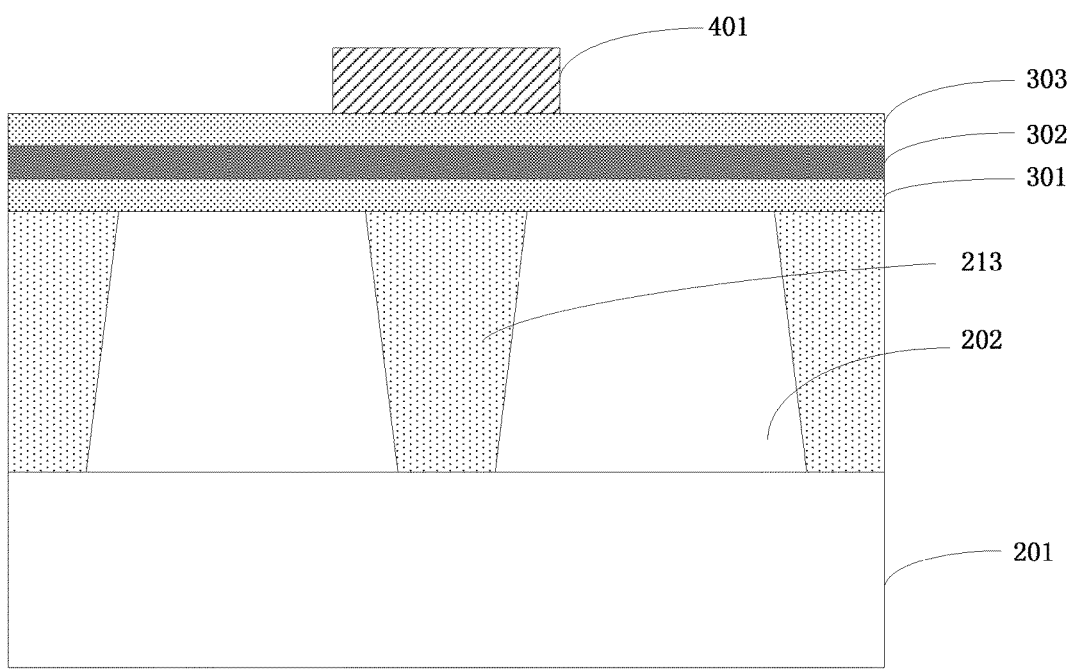
Figure 5A:
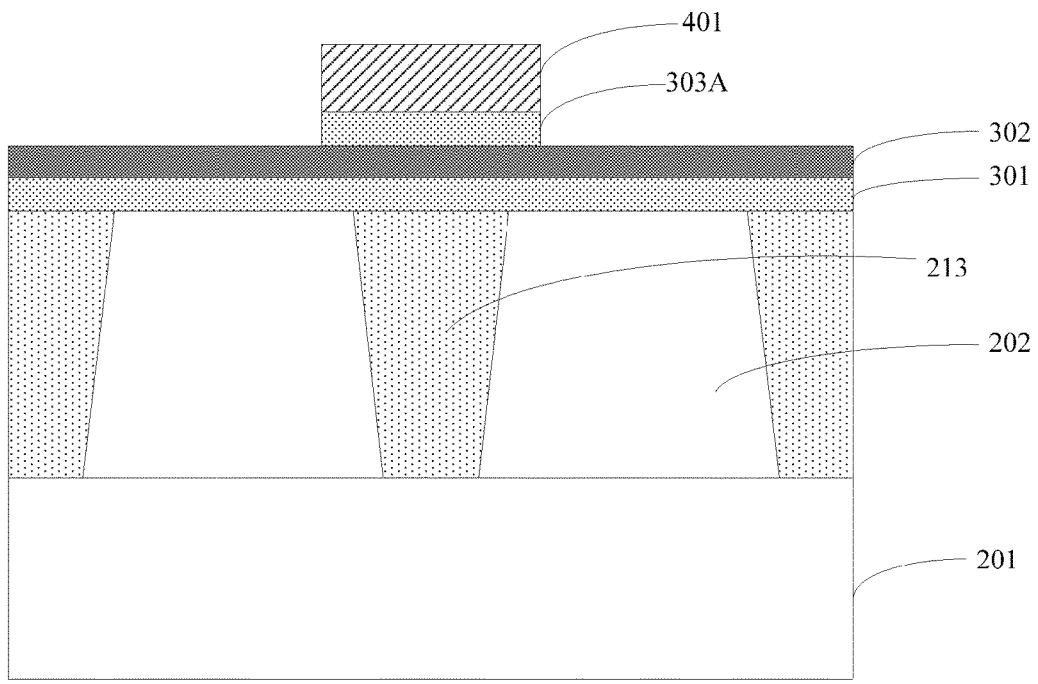
Figure 5B:
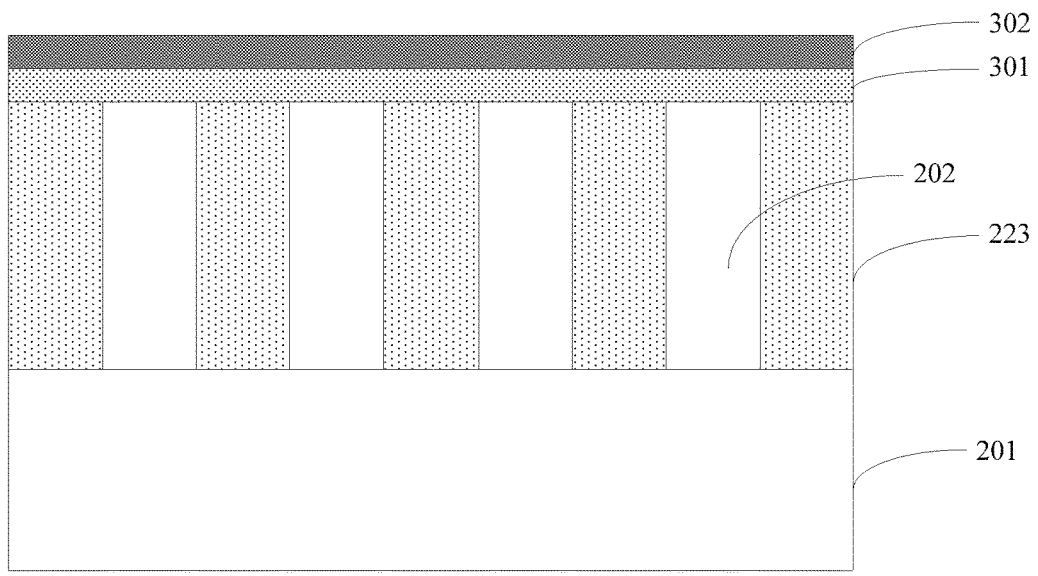

Subsequently, in step 106, a patterned barrier layer 401 on the third insulating layer 303 above at least one of the first isolation regions 213 is formed, as shown in FIG. 4 (a cross-sectional view along the first direction). FIG. 4, shows as an example, the patterned barrier layer 401 covering one isolation region 213 between two fins. The description below of the forms of rest of the processing steps of the substrate structure will be based on the patterned barrier layer 401 of FIG. 4. The underlying principles are applicable to a patterned barrier layer 401 covering multiple isolation regions 213.

In a form, the patterned barrier layer 401 of FIG. 4 may also cover the third insulating layer 303 above end portions of the fins 202 adjacent to the first isolation region 213 covered by the patterned barrier layer 401 along the first direction. In other words, a width of the patterned barrier layer 401 along the first direction is greater than or equal to a width of the first isolation regions 213 along the first direction. In an implementation, the patterned barrier layer 401 may be formed by coating photoresist on the third insulating layer 303, and then patterning the photoresist. For example, the photoresist may be patterned by using the Single Diffusion Break (Single Diffusion Break, SDB) technology.

Again, it should be noted that FIG. 4 merely shows the implementation that the patterned barrier layer 401 is located on one of the first isolation regions 213 between two fins. In other forms, the barrier layer 401 may similarly be formed on other isolation regions 213 between other fins along the first direction.

Subsequently, in step 108, a first etching process using the patterned barrier layer 401 as a mask is performed to remove an exposed portion (not covered by the patterned barrier layer 401) of the third insulating layer 303. Following the first etching process, a portion of the third insulating layer that was covered by the patterned barrier layer 401 remains, as shown by 303A in the cross-sectional views along the first and second directions in FIG. 5A and FIG. 5B. Further, a portion of the second insulating layer 302 not under the remaining portion 303A of the third insulation layer (covered by the patterned barrier layer 401) is exposed. In a form, the first etching process may be performed by using dry etching or wet etching. In a form, the first etching process may be stopped at the second insulating layer 302.

Figure 6:
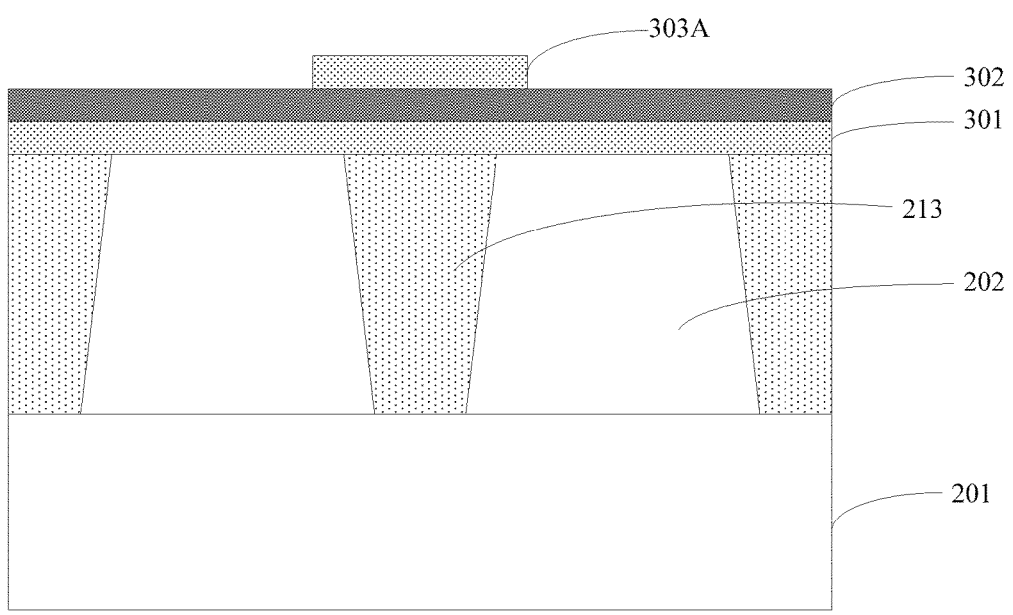

Subsequently, in step 110, the patterned barrier layer 401 is removed to expose the remaining portion 303A of the third insulating layer, as shown in the cross-sectional view along the first direction in FIG. 6.

Figure 7A:
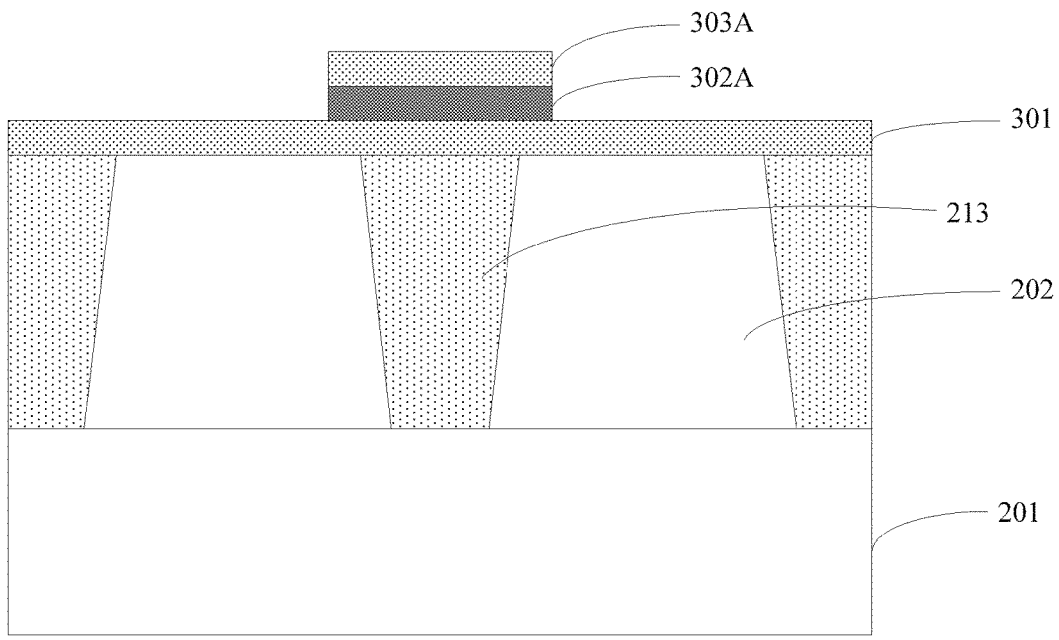
Figure 7B:
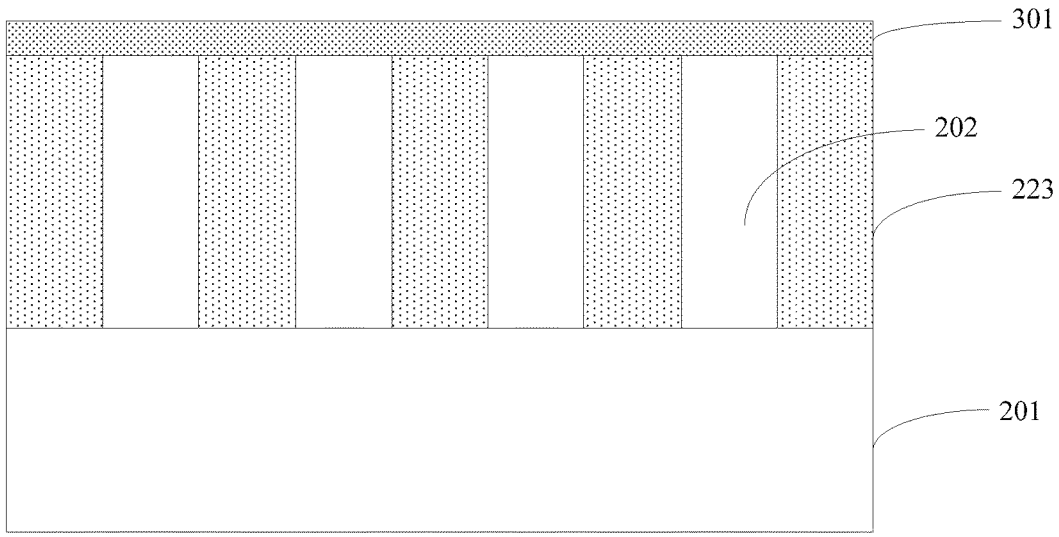

Subsequently, in step 112, a second etching process is performed using the remaining portion 303A of the third insulating layer as a mask to remove the exposed portion of the second insulating layer. After the second etching process, a portion 302A of the second insulating layer not exposed and that was covered by the remaining portion 303A of the third insulating layer remains, as shown in FIG. 7A and FIG. 7B. Further, after the second etching process, portion of the first insulating layer 301 not covered by the remaining portion 303A of the third insulating layer is exposed. In a form, the second etching process may be stopped at the first insulating layer 301.

Figure 8A:
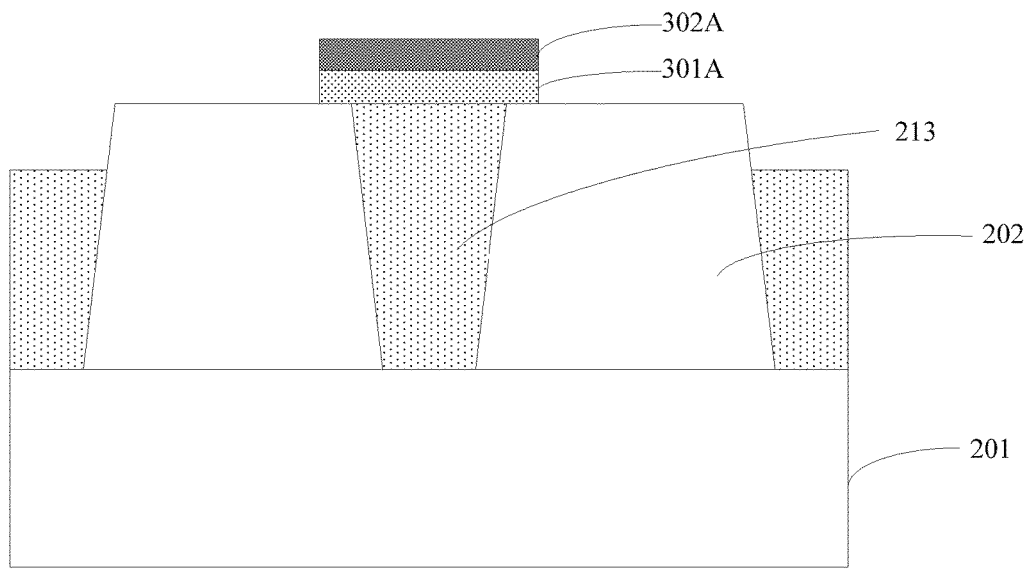
Figure 8B:
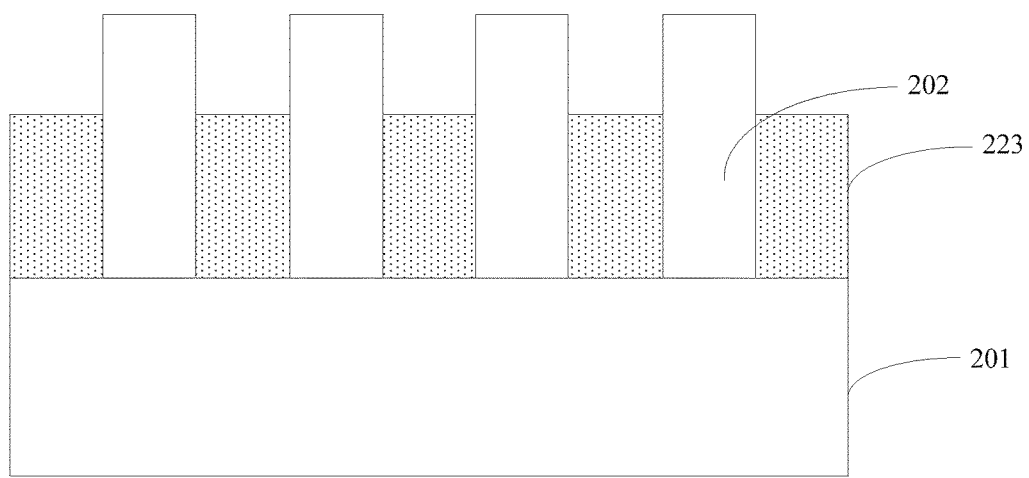

Subsequently, in step 114, a third etching process is performed to remove the remaining portion 303A of the third insulating layer, remove the exposed portion of the first insulating layer 301, and remove upper part of the second isolation regions 223 (and remove upper part of the first isolation regions 213 not covered by the original patterned barrier layer 401), as shown in FIG. 8A and FIG. 8B. As a result, an upper surface of the remaining second isolation regions 223 is lower than upper surfaces of the fins 202, as shown in FIG. 8A and FIG. 8B. In the third etching process, the remaining portion of the first insulating layer, 301A, that is covered by the remaining portion 302A of the second insulating layer remains. In a form, the third etching process may include multiple etching steps. For example, the remaining third insulating layer 303A may be removed first; then the exposed first insulating layer 301 is removed by using the remaining portion 302A of the second insulating layer as a mask; and subsequently, a upper part of the second isolation region 223 is removed by using an etching-back process. In another alternative implementation, the third etching process may only include one etching step. For example, the materials of the first insulating layer 301, the third insulating layer 303, and the second isolation region 223 may be the same. Therefore, by one etching process, the remaining portion 303A of the third insulating layer, the exposed first insulating layer, and the upper part of the second isolation region 223 may be removed in one etching process. The third etching process removes upper part of the second isolation regions (or the isolation regions located on sides rather than ends of the fins) other than the first isolation region or regions covered originally by the patterned barrier layer 401 (or the isolation regions located on ends rather than sides of the fins), so that upper surfaces of the remaining second isolation regions are lower than the upper surfaces of the fins.

Figure 9A:
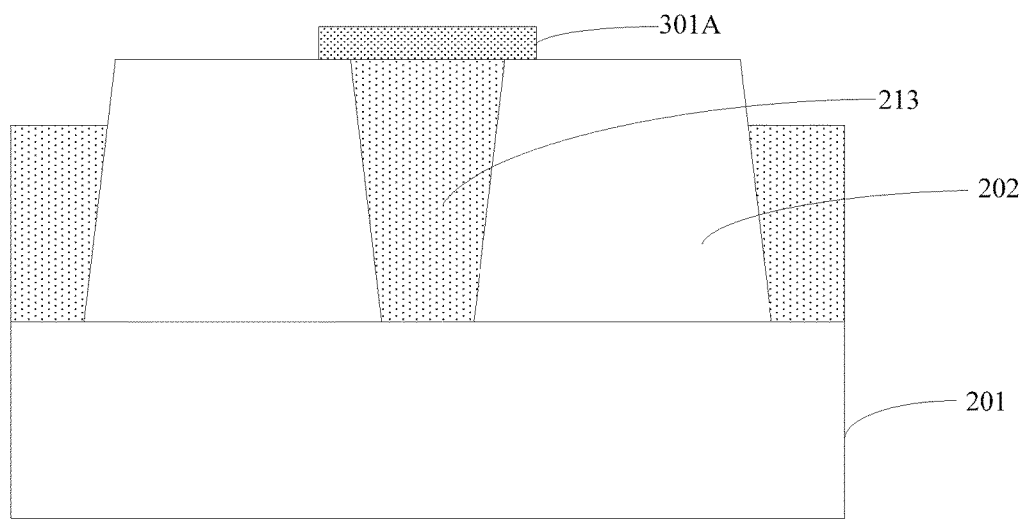
Figure 9B:
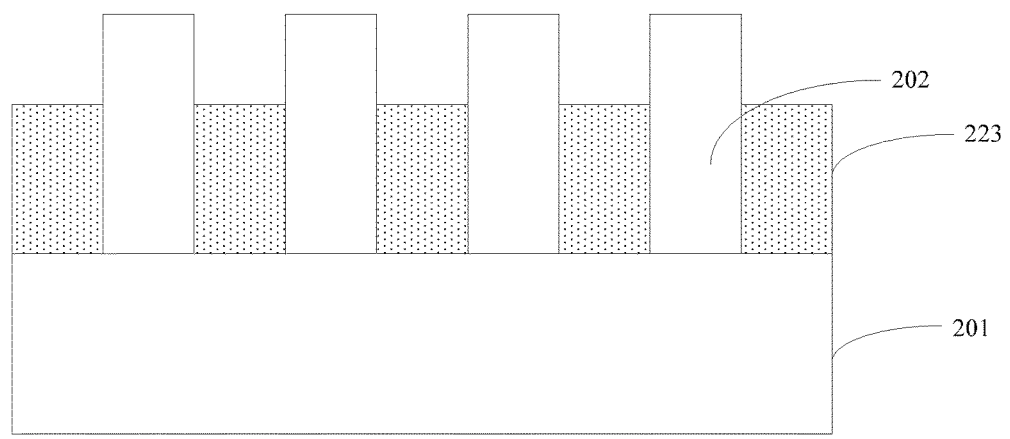

Subsequently, in step 116, the remaining portion 302A of the second insulating layer is removed, and the remaining portion 301A of the first insulating layer on the first isolation regions 213 is retained, as shown in FIG. 9A and FIG. 9B.

A method for manufacturing a semiconductor device is described above. According to the method, a first isolation regions and a second isolation regions of different heights are obtained. An upper surface of the first isolation regions substantially aligns with the upper surfaces of the fins, and a first insulating layer is formed on the first isolation regions. Therefore, even though a dummy gate structure which may be subsequently formed on the first insulating layer (corresponding the second gate structure below) may deviate in position due to imprecision in manufacturing process, the deviation would not form a bridge with the fins, thereby reducing electrical leakage that may occur when the dummy gate structure forms a bridge with the fins. The processes above thus improve the device performance and reliability. In addition, although the dummy gate structure may deviate in position, a contour of a semiconductor material that may later be epitaxially grown in the fins (see below) would not be affected. Therefore, the stress introduced into a channel would not be affected, and the carrier mobility of a device is consequently improved.

According to the aforementioned method, a semiconductor device is obtained. Description is made in the following with reference to FIG. 9A and FIG. 9B.

As shown in FIG. 9A and FIG. 9B, the semiconductor device includes: a substrate 201; one or more fins 202 located on the substrate and extending along a first direction; and an isolation material layer around the fins. The isolation material layer includes one or more first isolation regions 213 and one or more second isolation regions 223, where the first isolation regions 213 are located on ends of the fins 202 along the first direction of the fins; the second isolation regions 223 are located on side of fins 202 along the second direction different from the first direction of the fins; and where an upper surface of the first isolation regions 213 substantially aligns with upper surfaces of the fins 202, and an upper surface of the second isolation regions 223 is lower than the upper surfaces of the fins 202. The semiconductor device further includes a first insulating layer 301A located on the first isolation regions 213. In a form, the first insulating layer 301A may further extend over end portions of the fins 202 adjacent to the first isolation regions 213.

Figure 10:
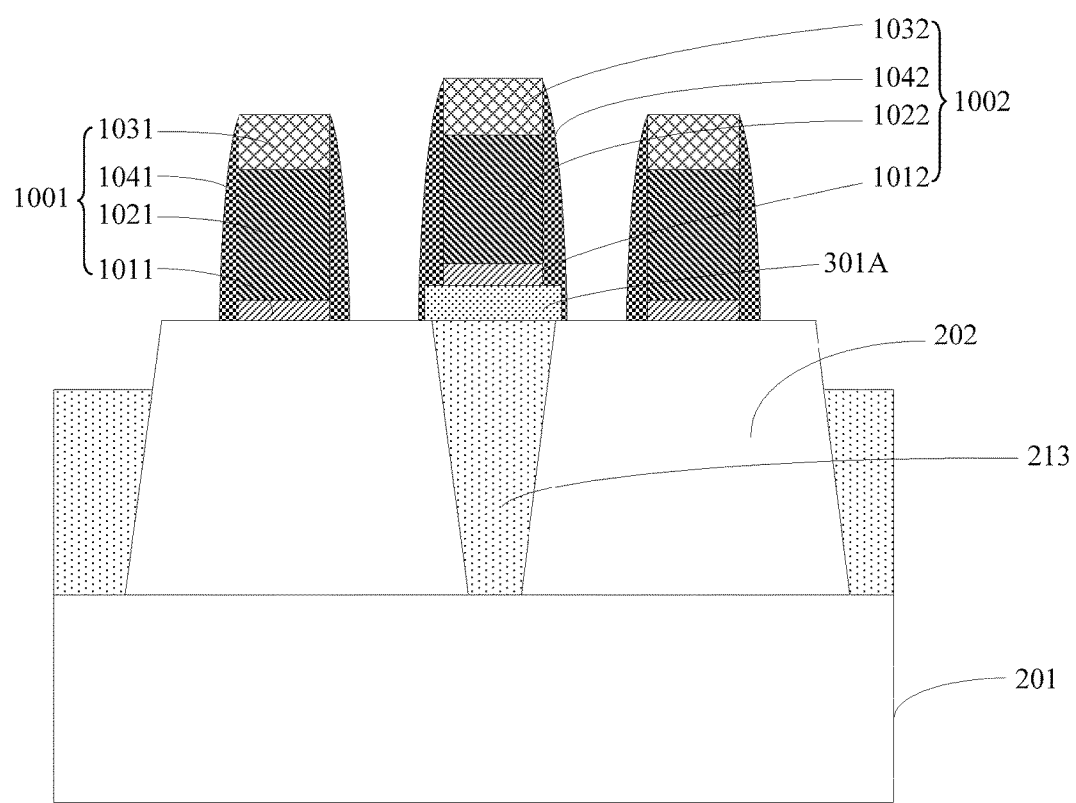

After the semiconductor device shown in FIG. 9A and FIG. 9B is formed, in a form, the aforementioned method may further include: forming a first gate structure 1001 on the a fin 202, and forming a second gate structure 1002 on the remaining portion 301A of the first insulating layer above the first isolation region, as shown in FIG. 10. Herein, the second gate structure may be a dummy gate structure.

In a form, the first gate structure 1001 may include a first gate dielectric layer 1011 on the fin 202 (for example, silicon oxide), a first gate 1021 on the first gate dielectric layer 1011 (for example, polysilicon), a first hard mask layer 1031 on the first gate 1021 (for example, silicon nitride), and a first spacer 1041 at side walls of the first gate dielectric layer 1011, the first gate 1021, and the first hard mask layer 1031 (for example, silicon oxide or silicon nitride) along the second direction. In a form, the second gate structure 1002 may include a second gate dielectric layer 1012 on the remaining portion 301A of the first insulating layer (for example, silicon oxide), a second gate 1022 on the second gate dielectric layer 1012 (for example, polysilicon), a second hard mask layer 1032 on the second gate 1022 (for example, silicon nitride), and a second spacer 1042 at side walls of the second gate dielectric layer 1012, the second gate 1022, and the second hard mask layer 1032 (for example, silicon oxide or silicon nitride). Here, the second spacer 1042 is on top of and overlaps end portions of the fins 202 adjacent to the first isolation region 213 under the second gate structure 1002.

Figure 11:
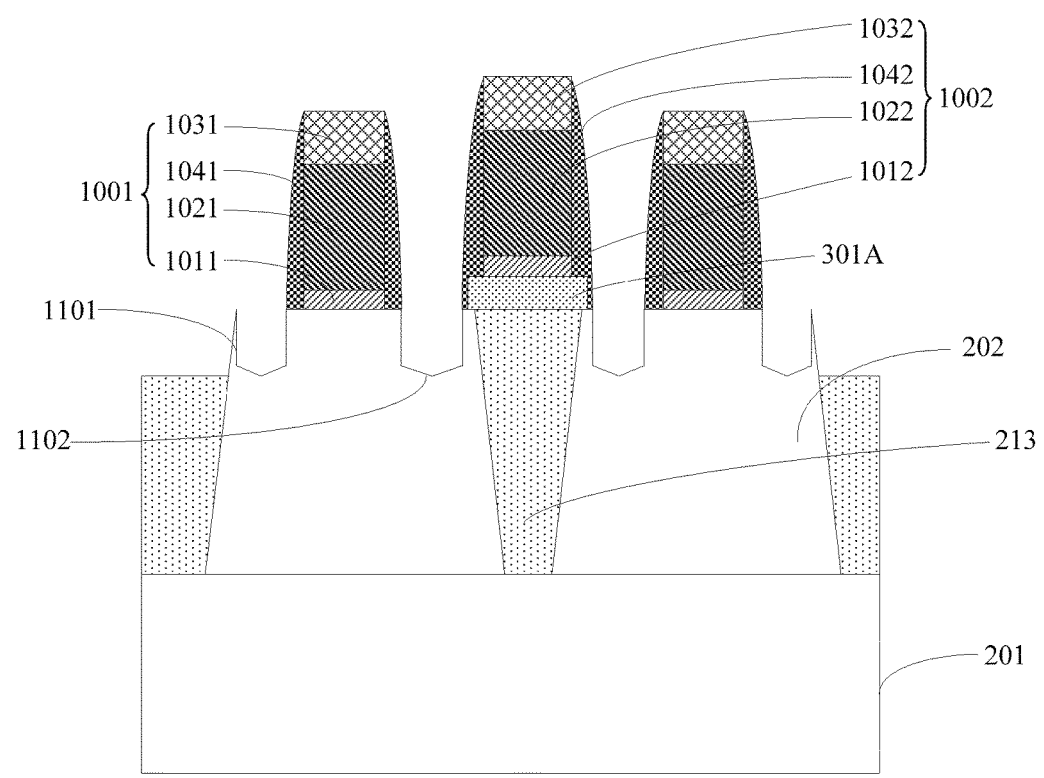
Figure 12:
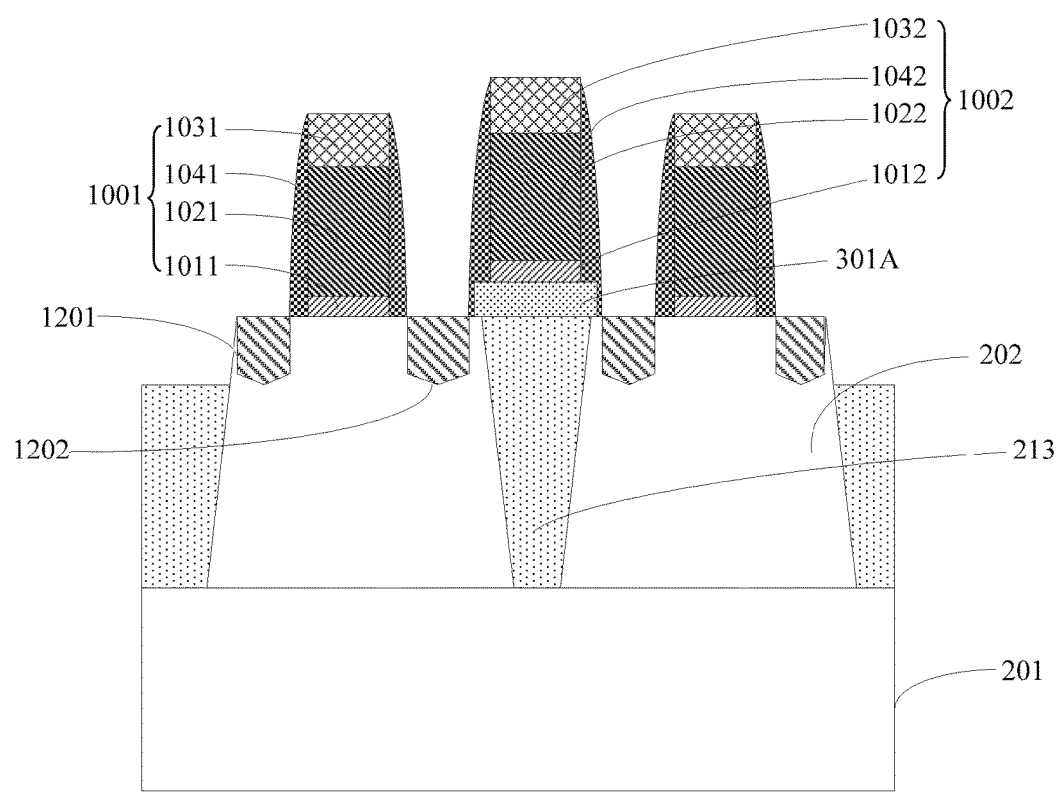

After the first gate structure 1001 and the second gate structure 1002 are formed, in a form, the method may further include etching, by using the first gate structure 1001 and the second gate structure 1002 as masks, the fins 202 at two sides of the first gate structure 1001 (or two ends of the fins 202) to form recesses such as a first recess 1101 and a second recess 1102, as shown in FIG. 11. The method may then further include epitaxially growing a semiconductor material in the recesses, e.g., in the first recess 1101 and the second recess 1102, to form a source region 1201 and a drain region 1202, respectively, as shown in FIG. 12. In a form, the semiconductor material that epitaxially grown may include SiGe, SiC or Si. In addition, P dopants may be introduced in-situ when Si is epitaxially grown.

Therefore, the present disclosure further provides another semiconductor device, as shown in FIG. 12. Compared with the device shown in FIG. 9A and FIG. 9B, the semiconductor device shown in FIG. 12 further includes the first gate structure 1001 on at least a fin 202 and the second gate structure 1002 on the first insulating layer 301A above the first isolation region 213. The semiconductor device may further include a source region 1201 and a drain region 1202 formed by epitaxially grown semiconductor material in recesses in at the least one fin 202 formed on two sides of the first gate structure 1001. In a form of the semiconductor device, the first gate structure 1001 and the second gate structure 1002 may specifically include the gate structures described above, and are not described again here.

In the semiconductor device provided in the present disclosure above, an upper surface of the first isolation region substantially aligns with the upper surfaces of the fins, and a first insulating layer is formed on the first isolation region. Therefore, even though a dummy gate structure which may be subsequently formed on the first insulating layer (corresponding the second gate structure below) may deviate in position due to imprecision in manufacturing process, the deviation would not form a bridge with the fins, thereby reducing electrical leakage that may occur when the dummy gate structure forms a bridge with the fins. The processes above thus improve the device performance and reliability. In addition, although the dummy gate structure may deviate in position, a contour of a semiconductor material that may later be epitaxially grown in the fins (see below) would not be affected. Therefore, the stress introduced into a channel would not be affected, and the carrier mobility of a device is consequently improved.

The present disclosure further provides an exemplary method for forming the aforementioned substrate structure of FIG. 2. The method is described in detail in the following with reference to FIG. 13A to FIG. 17B.

Figure 13A:
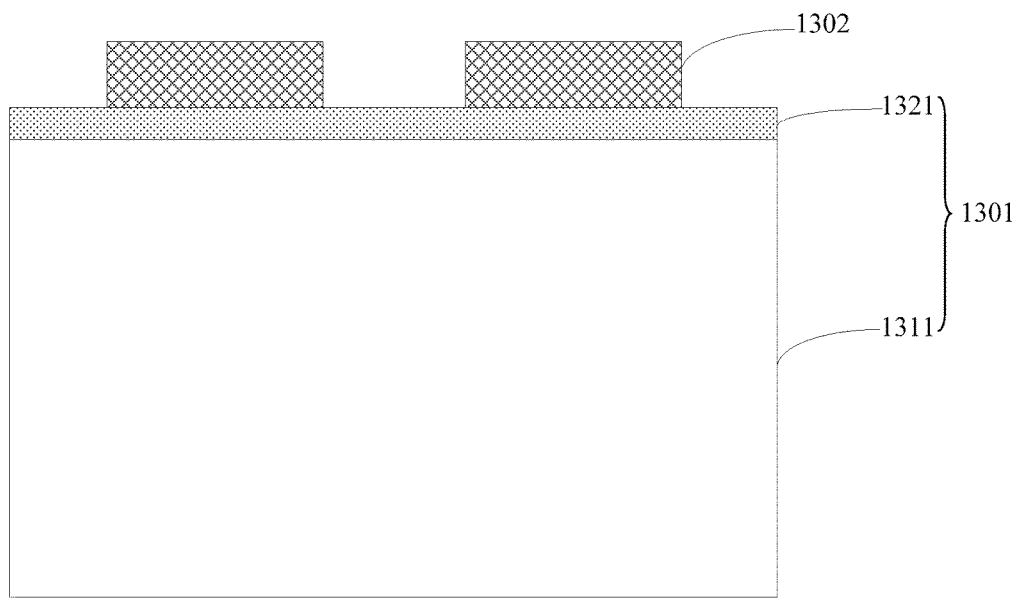
Figure 13B:
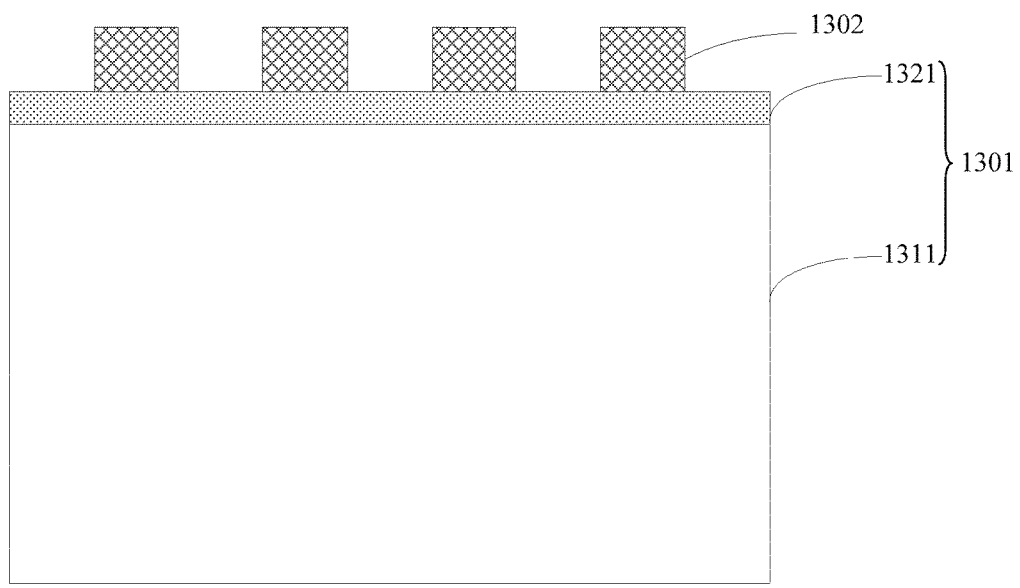

First, as shown in FIG. 13A and FIG. 13B, an initial substrate 1301 is provided, and a patterned hard mask 1302 on the initial substrate 1301 is formed. The hard mask 1302, for example, may comprise silicon nitride.

Various process may be used to form the patterned harm mask 1302. For example, the patterned hard mask 1302 may be formed by using a self-aligned double patterning (SADP) process.

In a form, the initial substrate 1301 may include a base semiconductor layer 1311 and a base oxide layer 1321 on the base semiconductor layer. The base oxide layer 1321 may serve as a buffer layer between the hard mask 1302 and the base substrate 1301, to reduce the stress in the base substrate 1301 caused by the hard mask 1302. However, the oxide layer 1321 may be optional.

Figure 14A:
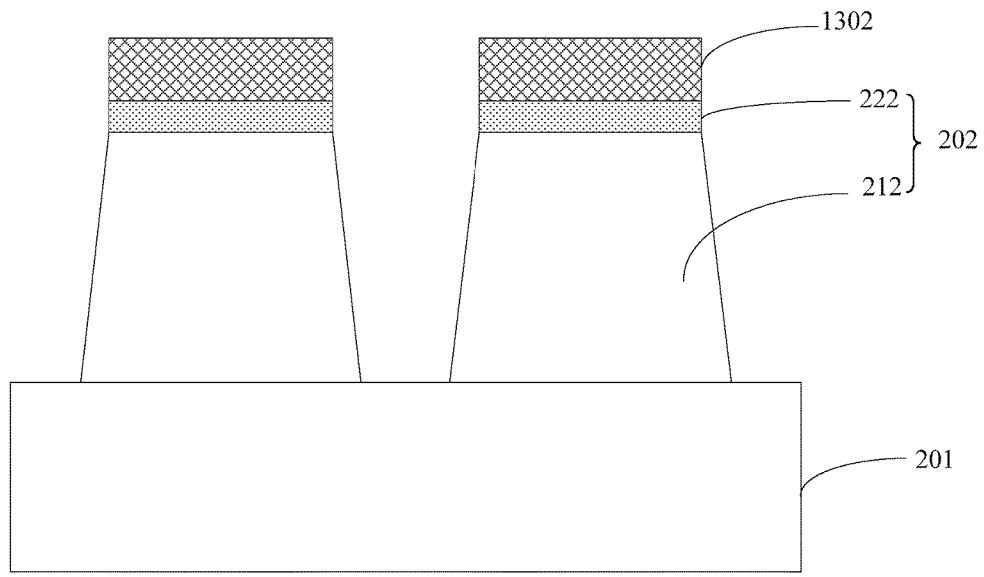
Figure 14B:
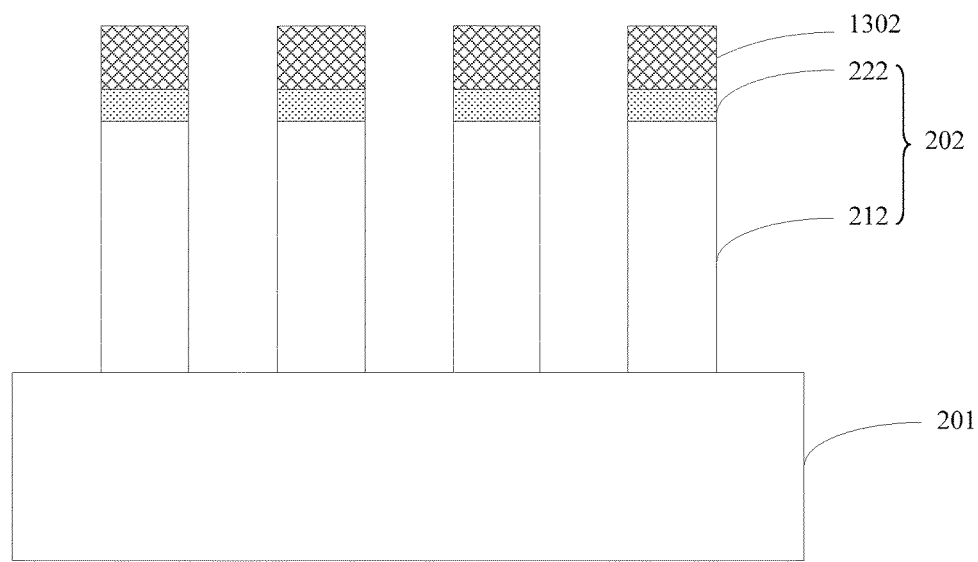

Then, as shown in FIG. 14A and FIG. 14B, the initial substrate 1301 is partially etched by using the hard mask 1302 as a mask, so as to form a substrate 201 and one or more fins 202 on the substrate 201. In a form, the initial substrate 1301 may include the base semiconductor layer 1311 and, optionally, the base oxide layer 1321 on the base semiconductor layer, so that the fins 202 formed after etching may include a semiconductor layer 212 and an oxide layer 222 on the semiconductor layer 212.

Figure 15A:
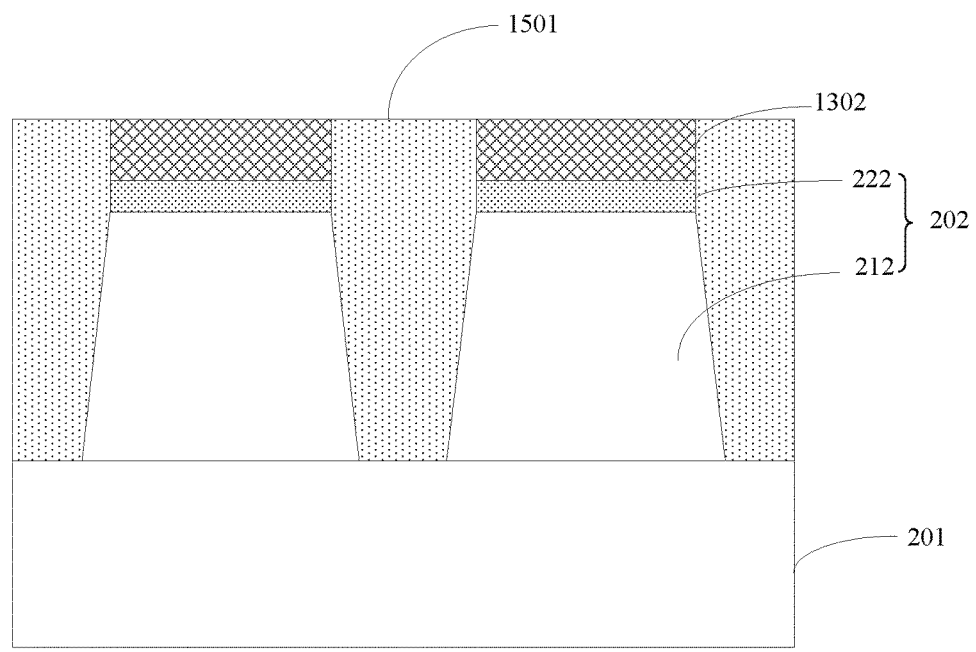
Figure 15B:
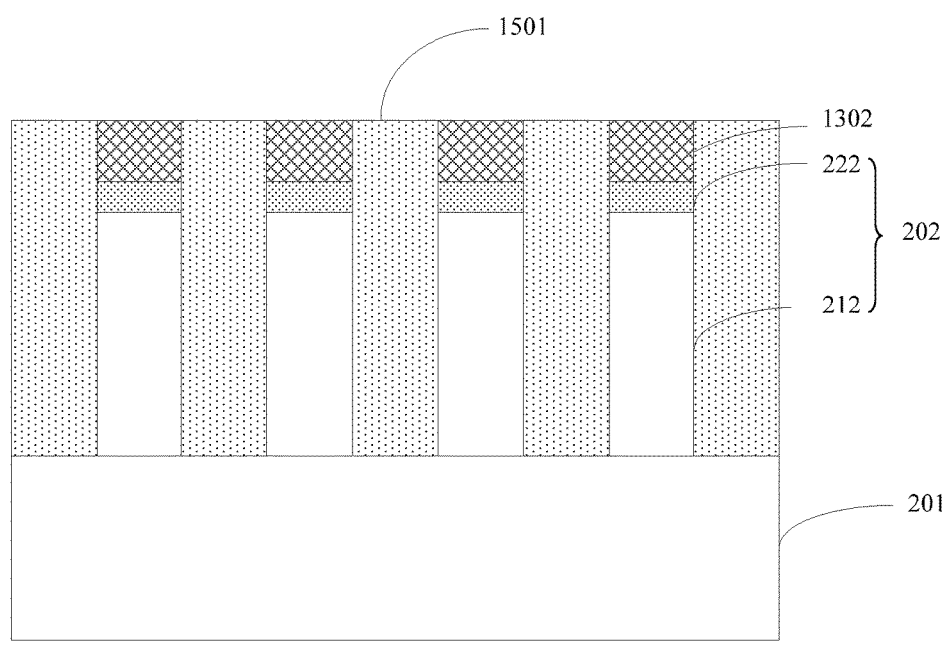

Next, as shown in FIG. 15A and FIG. 15B, an isolation material layer 1501 is deposited to fill a space around the fins 202, where an upper surface of the isolation material layer 1501 substantially aligns or is leveled with an upper surface of the hard mask 1302. For example, the isolation material layer 1501 (for example, silicon oxide) may be deposited using a fluidized chemical vapor deposition (FCVD), and then the isolation material layer 1501 is planarized, for example, through chemical-mechanical polishing (CMP), so that the upper surface of the isolation material layer 1501 substantially aligns with the upper surface of the hard mask 1302. Optionally, in a form, a liner layer may be formed on the surface of the structure shown in FIG. 14A before the isolation material layer 1501 is deposited. For example, silicon oxide liner layer may be formed through in-situ steam generation (ISSG). The liner layer may repair the damage on the surface of the fins caused by the etching process.

Figure 16A:
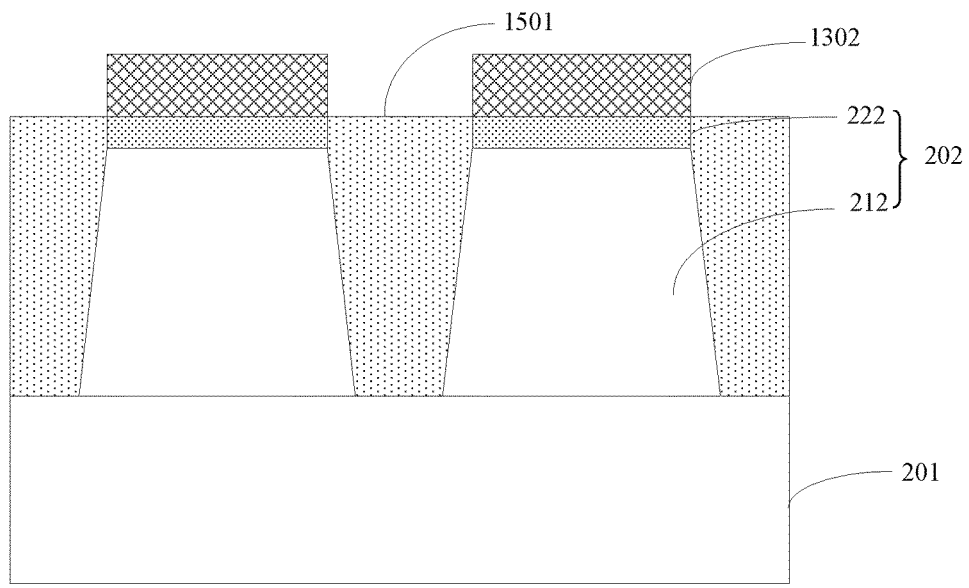
Figure 16B:
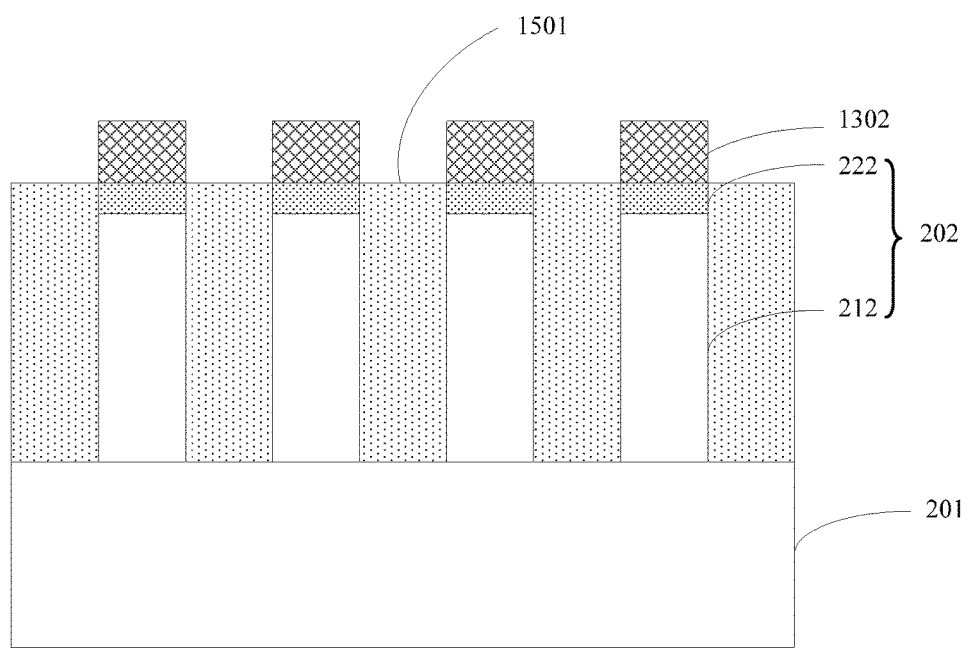

Then, as shown in FIG. 16A and FIG. 16B, the isolation material layer 1501 is etched back to expose the hard mask 1302.

Figure 17A:
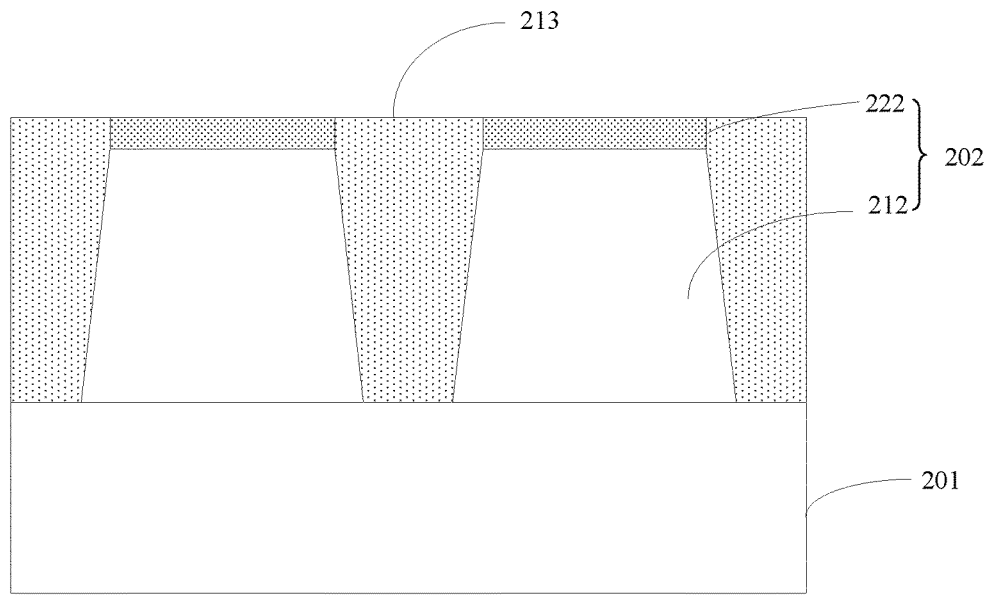
Figure 17B:
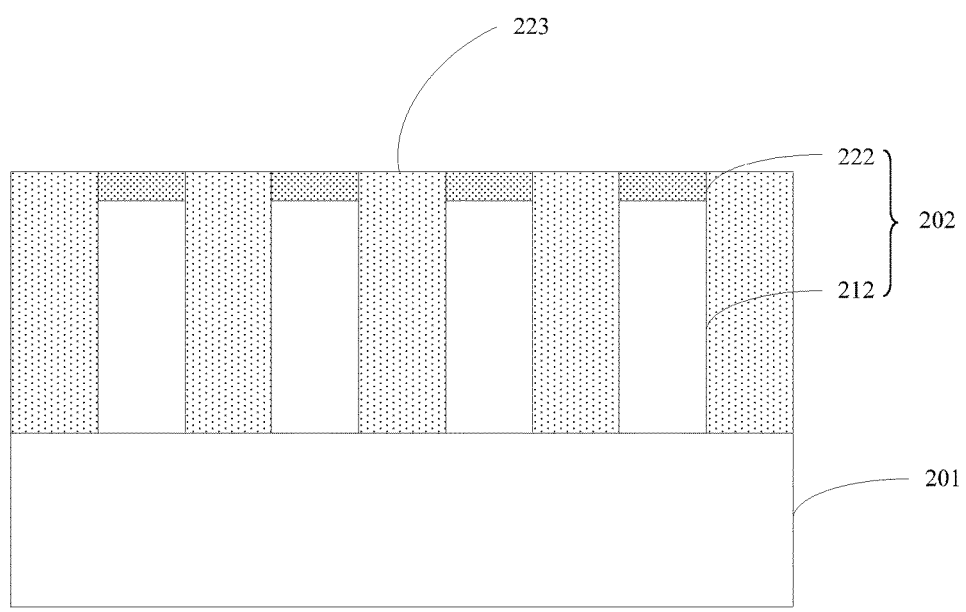

Next, as shown in FIG. 17A and FIG. 17B, the hard mask 1302 is removed to form the substrate structure It should be understood that compared with the substructure shown in FIGS. 2A and 2B, the substrate structure shown in FIG. 17A and FIG. 17B includes an additional oxide layer 222. However, the oxide layer 222, originated from the oxide layer 1321 in FIG. 13, is optional as described earlier.

After the substrate structure is formed according to steps shown in FIG. 13A to FIG. 17B, step 104 to step 116 may be performed according to the steps shown in FIG. 1 and the above description.

The semiconductor device and the manufacturing method therefor according to the present disclosure are described in detail above. To avoid obscuring the idea of the present disclosure, some details generally known in the art are not described. According to the foregoing description, a person of ordinary skill in the art may completely understand how to implement the technical solutions disclosed herein. In addition, the forms according to the teaching disclosed in the specification may be freely combined. A person of ordinary skill in the art should understand that amendments can be made to the forms without departing from the scope and the spirit of the present disclosure.

What is claimed is:

1. A method for manufacturing a semiconductor device, comprising:
   providing a substrate structure, wherein the substrate structure comprises:
   a substrate;
   a fin located on the substrate and extending along a first direction; and
   an isolation material layer on the substrate, the isolation material surrounding the fin and defining an upper surface that substantially aligns with an upper surface of the fin, wherein the isolation material layer comprises:
   a first isolation region located at an end region of the fin along the first direction; and
   a second isolation region located at sides of the fin along a second direction different from the first direction;
   successively forming a first insulating layer, a second insulating layer, and a third insulating layer on the substrate structure above the fin, wherein material of the second insulating layer has a different etching selectivity ratio than material of the first insulating layer and material of the third insulating layer;
   forming a patterned barrier layer above the third insulating layer, the patterned barrier layer covering the first isolation region and a corresponding part of the third insulating layer above the first isolation region;
   successively:
   performing a first etching process using the patterned barrier layer as a mask to remove an exposed portion of the third insulating layer and to expose a portion of the second insulating layer thereunder;
   removing the barrier layer to expose a remaining portion of third insulating layer above the first isolation region;
   performing a second etching process using the remaining portion of the third insulating layer as a mask to remove the exposed portion of the second insulating layer and to expose a portion of the first insulating layer thereunder;
   performing a third etching process to remove the remaining portion of the third insulating layer and expose a remaining portion of the second insulating layer thereunder, and to remove the exposed portion of the first insulating layer;
   removing an upper part of isolation material in the second isolation region; and
   removing the remaining portion of the second insulating layer to expose a remaining portion of the first insulating layer thereunder.

2. The method according to claim 1, wherein the patterned barrier layer, when formed, further extends beyond the first isolation region and covers the third insulating layer above at least one portion of the fin adjacent to the first isolation region along the first direction.

3. The method according to claim 1, wherein
the first insulating layer comprises an oxide;
the second insulating layer comprises a nitride; and
the third insulating layer comprises an oxide.

4. The method according to claim 1, wherein providing the substrate structure comprises:
providing an initial substrate;
forming a patterned hard mask on the initial substrate;
etching the initial substrate using the hard mask as a shield, so as to form the substrate and the fin located on the substrate;
depositing the isolation material layer to fill a space around the fin, wherein an upper surface of the isolation material layer substantially aligns with the upper surface of the patterned hard mask;
etching back the isolation material to expose the patterned hard mask; and
removing the patterned hard mask, so as to form the substrate structure.

5. The method according to claim 4, wherein
the initial substrate comprises a base semiconductor layer and a base oxide layer located on the base semiconductor layer; and
the fin correspondingly comprises a semiconductor layer and an oxide layer located on the semiconductor layer.

6. The method according to claim 1, further comprising:
forming a first gate structure on the fin and forming a second gate structure on the remaining first insulating layer.

7. The method according to claim 6, further comprising:
etching, by using the first gate structure and the second gate structure as masks, the fin at two sides of the first gate structure corresponding to two ends of the fin along the first direction to form recesses; and
epitaxially growing a semiconductor material in the recesses to form a source region and a drain region.

8. The method according to claim 7, wherein the epitaxially grown semiconductor material comprises SiGe or SiC.

9. The method according to claim 6, wherein
the first gate structure comprises a first gate dielectric layer on the fin, a first gate on the first gate dielectric layer, a first hard mask layer on the first gate, and a first spacer at side walls of the first gate dielectric layer, the first gate, and the first hard mask layer along the second direction; and
the second gate structure comprises a second gate dielectric layer on the remaining first insulating layer, a second gate on the second gate dielectric layer, a second hard mask layer on the second gate, and a second spacer at side walls of the second gate dielectric layer, the second gate, and the second hard mask layer along the second direction, wherein the second spacer is above and overlaps an end portion of the fin adjacent to the first isolation region below the second gate structure.

10. The method according to claim 9, wherein
the first gate dielectric layer and the second gate dielectric layer comprise silicon oxide;
the first gate and the second gate comprise polysilicon; and
the first hard mask layer and the second hard mask layer comprise silicon nitride.

* * * * *